(12) United States Patent
Lin et al.

(10) Patent No.: US 8,957,493 B1
(45) Date of Patent: Feb. 17, 2015

(54) SEMICONDUCTOR DEVICE

(71) Applicant: Delta Electronics, Inc., Taoyuan Hsien (TW)

(72) Inventors: Li-Fan Lin, Taoyuan Hsien (TW); Wen-Chia Liao, Taoyuan Hsien (TW)

(73) Assignee: Delta Electronics, Inc. (TW)

( * ) Notice: Subject to any disclaimer, the term of this patent is extended or adjusted under 35 U.S.C. 154(b) by 0 days.

(21) Appl. No.: 14/185,322

(22) Filed: Feb. 20, 2014

(30) Foreign Application Priority Data

Sep. 10, 2013 (TW) .............................. 102132512 A

(51) Int. Cl.
H01L 29/78 (2006.01)
H01L 29/20 (2006.01)

(52) U.S. Cl.
CPC ............ *H01L 29/2003* (2013.01); *H01L 29/78* (2013.01)
USPC ................... 257/459; 257/503; 257/E23.015; 257/E23.02

(58) Field of Classification Search
USPC ...................... 257/459, 503, E23.015, E23.02
See application file for complete search history.

(56) References Cited

U.S. PATENT DOCUMENTS

| 8,274,121 B2 | 9/2012 | Vorhaus |
| 8,431,998 B2 * | 4/2013 | Miyata .......................... 257/355 |
| 2005/0017296 A1 * | 1/2005 | Hoshino et al. ................ 257/334 |

FOREIGN PATENT DOCUMENTS

| TW | 506069 | 10/2002 |
| TW | 533579 | 5/2003 |

* cited by examiner

*Primary Examiner* — Selim Ahmed
(74) *Attorney, Agent, or Firm* — Lowe Hauptman & Ham, LLP

(57) ABSTRACT

A semiconductor device includes an active layer, at least one source electrode, at least one drain electrode, at least one gate electrode, a first insulating layer, a first source pad, a first drain pad, at least one source plug, and at least one drain plug. The source electrode and the drain electrode are both disposed on the active layer. Projections of the source electrode and the drain electrode on the active layer form a source region and a drain region, respectively. The first source pad and the first drain pad are both disposed on the first insulating layer. A projection of the first source pad on the active layer forms a source pad region. An area of an overlapping region between the source pad region and the drain region is smaller than or equal to 40% of an area of the drain region.

20 Claims, 12 Drawing Sheets

SEMICONDUCTOR DEVICE

RELATED APPLICATIONS

This application claims priority to Taiwan Application Serial Number 102132512, filed Sep. 10, 2013, which is herein incorporated by reference.

BACKGROUND

1. Field of Invention

The present invention relates to a semiconductor device.

2. Description of Related Art

A field effect transistor, which controls a current flowing through it with an electric field generated in a material layer, is a switch device widely utilized in circuits made up of semiconductor devices. In greater detail, a field effect transistor includes a gate electrode, a source electrode, a drain electrode, and an active layer. The source electrode and the drain electrode are located at opposite sides of the active layer. By controlling the voltage applied to the gate electrode, the electric field in the active layer is affected to allow current to flow from the source electrode to the drain electrode. As a result, the field effect transistor is in an on state.

Generally speaking, a field effect transistor may further include a source pad and a drain pad, which are electrically connected to the source electrode and the drain electrode respectively, to allow the field effect transistor to be electrically connected to another device. The source pad and the drain pad usually have large bonding areas to facilitate the bonding of external circuits. With the progress made in semiconductor processing, field effect transistors have become smaller and smaller. Therefore, it is very important to provide a field effect transistor with a well-placed source pad and drain pad so as to provide adequate bonding areas and generate less electrical interference on the field effect transistor itself.

SUMMARY

An aspect of the present invention provides a semiconductor device including an active layer, at least one source electrode, at least one drain to electrode, at least one gate electrode, a first insulating layer, a first source pad, a first drain pad, at least one source plug, and at least one drain plug. The source electrode is disposed on the active layer, and an orthogonal projection of the source electrode on the active layer forms a source region. The drain electrode is disposed on the active layer. The drain electrode is separate from the source electrode, and an orthogonal projection of the drain electrode on the active layer forms a drain region. The gate electrode is disposed above the active layer and between the source electrode and the drain electrode. The first insulating layer at least covers a portion of the source electrode and a portion of the drain electrode. The first insulating layer has at least one source via hole and at least one drain via hole within the first insulating layer. The first source pad is disposed on the first insulating layer. An orthogonal projection of the first source pad on the active layer forms a source pad region. The source pad region overlaps at least a portion of the drain region. An area of an overlapping region between the source pad region and the drain region is smaller than or equal to 40% of an area of the drain region. The first drain pad is disposed on the first insulating layer. The source plug is filled in the source via hole and is electrically connected to the first source pad and the source electrode. The drain plug is filled in the drain via hole and is electrically connected to the first drain pad and the drain electrode.

In one or more embodiments, an orthogonal projection of the first drain pad on the active layer forms a drain pad region. The drain pad region overlaps at least a portion of the source region, and an area of an overlapping region between the drain pad region and the source region is smaller than or equal to 40% of an area of the source region.

In one or more embodiments, a resistance value of the first source pad per unit length is smaller than a resistance value of the source electrode per unit length.

In one or more embodiments, a resistance value of the first drain pad per unit length is smaller than a resistance value of the drain electrode per unit length.

In one or more embodiments, the orthogonal projection of the source electrode on the active layer, the orthogonal projection of the drain electrode on the active layer, an orthogonal projection of the gate electrode on the active layer, and a region in which current passes through the active layer together define an active area, and at least a portion of the source pad region is within the active area.

In one or more embodiments, the source pad region is completely within the active area.

In one or more embodiments, at least a portion of the drain pad region is within the active area.

In one or more embodiments, the drain pad region is completely within the active area.

In one or more embodiments, the first source pad includes a source pad body and at least one source pad branch. An orthogonal projection of the source pad body on the active layer overlaps at least a portion of the drain region.

In one or more embodiments, the first drain pad includes a drain pad body and at least one drain pad branch. The drain pad body is separate from the source pad body. An orthogonal projection of the drain pad body on the active layer overlaps at least a portion of the source region, and the source pad branch extends from the source pad body toward the drain pad body. The drain pad branch extends from the drain pad body toward the source pad body.

In one or more embodiments, the number of the source pad branches is plural. The number of the drain pad branches is plural. The source pad branches and the drain pad branches are alternately arranged between the source pad body and the drain pad body.

In one or more embodiments, the semiconductor device further includes a passivation layer covering the active layer. The passivation layer has at least one source opening and at least one drain opening within the passivation layer. At least a portion of the source electrode and at least a portion of the drain electrode are respectively disposed in the source opening and the drain opening to electrically electrode the active layer.

In one or more embodiments, the semiconductor device further includes a gate dielectric layer disposed at least between the gate electrode and the active layer.

In one or more embodiments, the gate dielectric layer further covers the passivation layer. The gate dielectric layer has at least one first inter-source via hole. The semiconductor device further includes an interlayer dielectric covering the gate dielectric layer. The interlayer dielectric has at least one second inter-source via hole. The source electrode further includes a lower sub-source electrode, an upper sub-source electrode, and at least one inter-source plug. The lower sub-source electrode is disposed in the source opening. The upper sub-source electrode is disposed on the interlayer dielectric. The inter-source plug is filled in the first inter-source via hole and the second inter-source via hole and is electrically connected to the upper sub-source electrode and the lower sub-source electrode.

In one or more embodiments, a resistance value of the upper sub-source electrode per unit length is smaller than a resistance value of the lower sub-source electrode per unit length.

In one or more embodiments, the gate dielectric layer further covers the passivation layer. The gate dielectric layer has at least one first inter-drain via hole. The semiconductor device further includes an interlayer dielectric covering the gate dielectric layer. The interlayer dielectric has at least one second inter-drain via hole. The drain electrode further includes a lower sub-drain electrode, an upper sub-drain electrode, and at least one inter-drain plug. The lower sub-drain electrode is disposed in the drain opening. The upper sub-drain electrode is disposed on the interlayer dielectric. The inter-drain plug is filled in the first inter-drain via hole and the second inter-drain via hole and is electrically connected to the upper sub-drain electrode and the lower sub-drain electrode.

In one or more embodiments, a resistance value of the upper sub-drain electrode per unit length is smaller than a resistance value of the lower sub-drain electrode per unit length.

In one or more embodiments, the active layer includes a gallium nitride layer and an aluminum gallium nitride layer. The aluminum gallium nitride layer is disposed on the gallium nitride layer.

In one or more embodiments, the semiconductor device further includes a second insulating layer, a second source pad, a second drain pad, a source pad connection portion, and a drain pad connection portion. The second insulating layer is disposed on the first source pad, the first drain pad, and the first insulating layer. The second insulating layer has a source pad opening and a drain pad opening to respectively expose a portion of the first source pad and a portion of the first drain pad, and the second insulating layer has a thickness greater than 7 μm. The second source pad is disposed on the second insulating layer. The second drain pad is separate from the second source pad and is disposed on the second insulating layer. The source pad connection portion is disposed in the source pad opening and is electrically connected to the first source pad and the second source pad. The drain pad connection portion is disposed in the drain pad opening and is electrically connected to the first drain pad and the second drain pad.

In one or more embodiments, a material of the second insulating layer includes polyimide (PI), photoresist (PR), benzo cyclo butane (BCB), spin on glass (SOG), plastic, or their combinations.

Another aspect of the present invention provides a semiconductor device including an active layer, at least one source electrode, at least one drain electrode, at least one gate electrode, a first insulating layer, a first source pad, a first drain pad, at least one source plug, and at least one drain plug. The source electrode is disposed on the active layer, and an orthogonal projection of the source electrode on the active layer forms a source region. The drain electrode is disposed on the active layer. The drain electrode is separate from the source electrode, and an orthogonal projection of the drain electrode on the active layer forms a drain region. The gate electrode is disposed above the active layer and between the source electrode and the drain electrode. The first insulating layer at least covers a portion of the source electrode and a portion of the drain electrode. The first insulating layer has at least one source via hole and at least one drain via hole within the first insulating layer. The first source pad is disposed on the first insulating layer. The first drain pad is disposed on the first insulating layer. An orthogonal projection of the first drain pad on the active layer forms a drain pad region. The drain pad region overlaps portion of the source region, and an area of an overlapping region between the drain pad region and the source region is smaller than or equal to 40% of an area of the source region. The source plug is filled in the source via hole and is electrically connected to the first source pad and the source electrode. The drain plug is filled in the drain via hole and is electrically connected to the first drain pad and the drain electrode.

DETAILED DESCRIPTION

Figure 1:
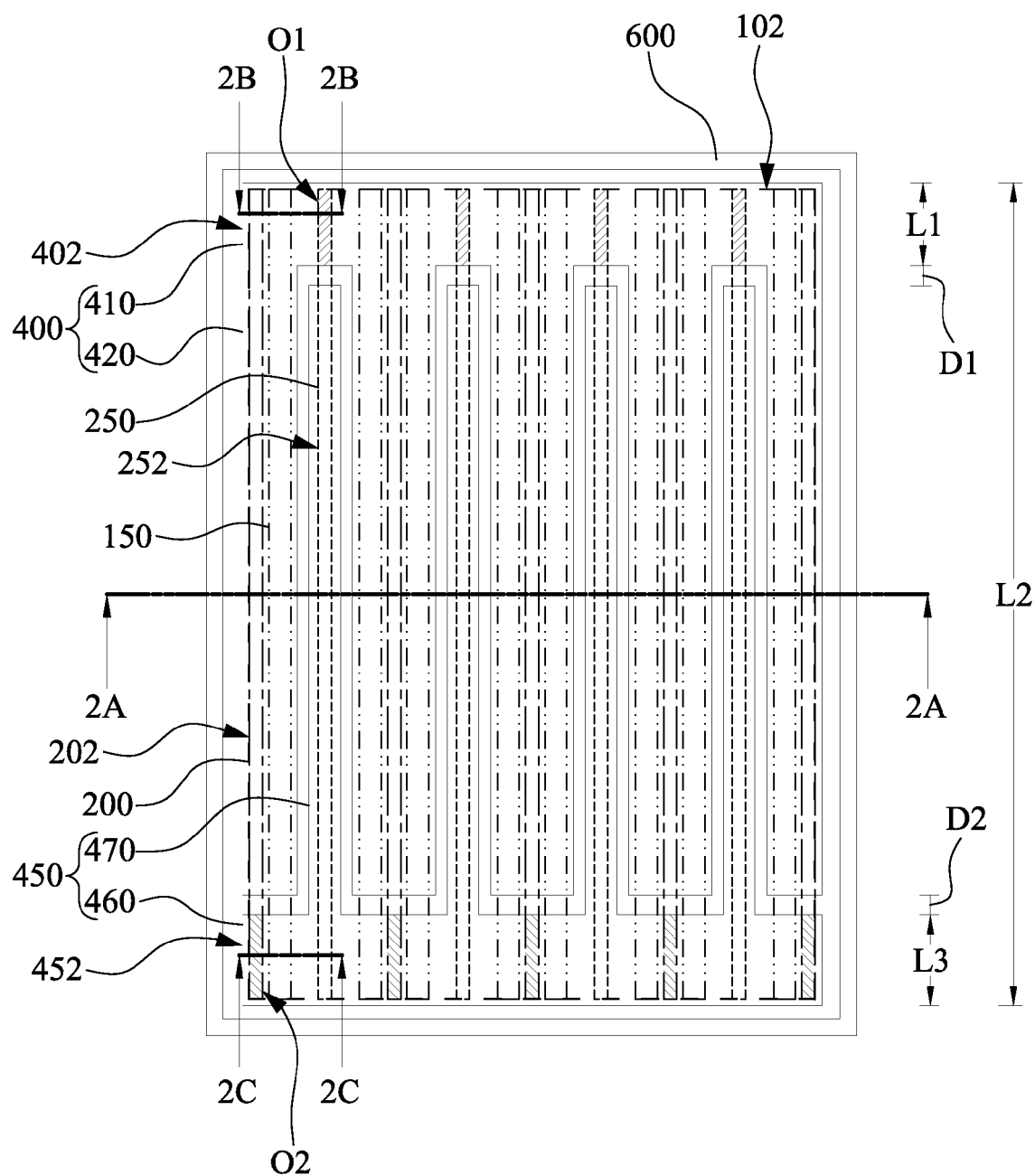
FIG. 1 is a top view of a semiconductor device according to a first embodiment of the present invention.

Reference will now be made in detail to the present embodiments of the invention, examples of which are illustrated in the accompanying drawings. Wherever possible, the same reference numbers are used in the drawings and the description to refer to the same or like parts. The practical details of the invention will be described below. However, it should be understood that such description is only to illustrate and not to limit the scope of the invention. That is, in some embodiments of the invention, the practical details are not necessary. In addition, for the sake of simplifying the drawings, known structures and components will be depicted schematically.

Figure 2A:
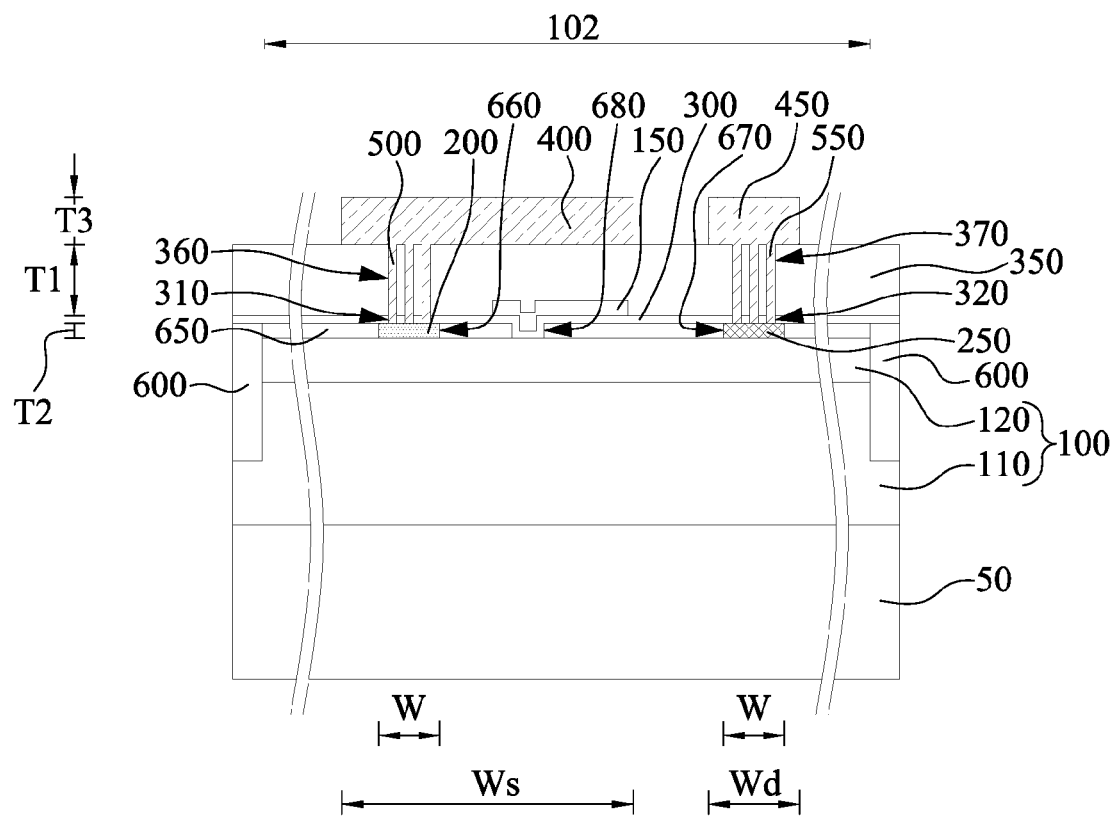
FIG. 2A is a cross-sectional view taken along line 2A-2A of FIG. 1.

FIG. 1 is a top view of a semiconductor device according to a first embodiment of the present invention. FIG. 2A is a cross-sectional view taken along line 2A-2A of FIG. 1. The semiconductor device includes an active layer 100, at least one gate electrode 150, at least one source electrode 200, at least one drain electrode 250, a gate dielectric layer 300, a first insulating layer 350, a first source pad 400, a first drain pad 450, at least one source plug 500, and at least one drain plug 550. The source electrode 200 is disposed on the active layer 100, and an orthogonal projection of the source electrode 200 on the active layer 100 forms a source region 202. The drain electrode 250 is disposed on the active layer 100. The drain electrode 250 is separate from the source electrode 200, and an orthogonal projection of the drain electrode 250 on the active layer 100 forms a drain region 252. The gate electrode 150 is disposed above the active layer 100 and between the source electrode 200 and the drain electrode 250. The gate dielectric layer 300 is disposed at least between the gate electrode 150 and the active layer 100. The first insulating layer 350 at least covers a portion of the source electrode 200 and a portion of the drain electrode 250. For example in FIG. 2A, the first insulating layer 350 covers the gate electrode 150, the source electrode 200, the drain electrode 250, and the gate dielectric layer 300. The semiconductor device further includes a gate pad (not shown), and the gate pad is electrically connected to the plurality of gate electrodes 150.

The first insulating layer 350 has at least one source via hole 360. A shape of the source via hole 360 may be different depending on process requirements. For example, the source via hole 360 may be formed in the shape of a circle, a rectangle, a polygon, an arc, or their combinations. The first source pad 400 is disposed on the first insulating layer 350, and an orthogonal projection of the first source pad 400 on the active layer 100 forms a source pad region 402. The source pad region 402 overlaps at least a portion of the drain region 252, and an area of an overlapping region O1 between the source pad region 402 and the drain region 252 is smaller than or equal to 40% of an area of the drain region 252. For example in FIG. 1, the overlapping region O1 has a length L1 and the drain electrode 250 has a length L2, and the length L1 is less than or equal to 40% of the length L2. The source plug 500 is filled in the source via hole 360 and electrically connected to the first source pad 400 and the source electrode 200.

The first insulating layer 350 further has at least one drain via hole 370 within it. The first drain pad 450 is disposed on the first insulating layer 350, and an orthogonal projection of the first drain pad 450 on the active layer 100 forms a drain pad region 452. The drain pad region 452 overlaps at least a portion of the source region 202, and an area of an overlapping region O2 between the drain pad region 452 and the source region 202 is smaller than or equal to 40% of an area of the source region 202. For example in FIG. 1, the overlapping region O2 has a length L3 and the source electrode 200 has the length L2, and the length L3 is less than or equal to 40% of the length L2. The drain plug 550 is filled in the drain via hole 370 and electrically connected to the first drain pad 450 and the drain electrode 250. For the sake of clarity, it is worth noting that both the source plug 500 and the drain plug 550 are only depicted in the cross-sectional view and not in the top view.

As mentioned previously, the overlapping region O1 is formed between the source pad region 402 and the drain region 252, and the overlapping region O2 is formed between the drain pad region 452 and the source region 202. In other words, at least a portion of the first source pad 400 is above the drain electrode 250 and at least a portion of the first drain pad 450 is above the source electrode 200. With this configuration, the semiconductor device size can shrink to increase the area utilization ratio of the active layer 100. The term area utilization ratio refers to the ratio of the area of the active layer 100 through which on currents flowing between the source electrodes 200 and the drain electrodes 250 actually pass to the area of the active layer 100 that is available for currents to pass through in the semiconductor device according to the present embodiment. Since the area of the overlapping region O1 is smaller than or equal to 40% of the area of the drain region 252 and the area of an overlapping region O2 is smaller than or equal to 40% of the area of the source region 202, parasitic capacitances generated between the first source pad 400 and the drain electrode 250 and between the first drain pad 450 and the source electrode 200 are effectively reduced. In another embodiment of the present invention, the area of the overlapping region O1 is greater than 1% of the area of the drain region 252 and smaller than 20% of the area of the drain region 252. The area of the overlapping region O2 is greater than 1% of the area of the source region 202 and smaller than 20% of the area of the source region 202.

With reference to FIG. 1, in greater detail, in the present embodiment the first source pad 400 includes a source pad body 410 and at least one source pad branch 420. A direction of the source pad body 410 is approximately perpendicular to an elongation direction of the source electrode 200, and an elongation direction of the source pad branch 420 is approximately parallel to the elongation direction of the source electrode 200. An orthogonal projection of the source pad body 410 on the active layer 100 (as depicted in FIG. 2A) overlaps at least a portion of the drain region 252, such as the overlapping region O1 in FIG. 1. The first drain pad 450 includes a drain pad body 460 and at least one drain pad branch 470. A direction of the drain pad body 460 is approximately perpendicular to an elongation direction of the drain electrode 250, and an elongation direction of the drain pad branch 470 is approximately parallel to the elongation direction of the drain electrode 250. The drain pad body 460 is separate from the source pad body 410. An orthogonal projection of the drain pad body 460 on the active layer 100 overlaps at least a portion of the source region 202, such as the overlapping region O2 in FIG. 1. The source pad branch 420 extends from the source pad body 410 toward the drain pad body 460. The drain pad branch 470 extends from the drain pad body 460 toward the source pad body 410. In another embodiment of the present invention, in addition to being strip-shaped, the source pad branch 420 may be wave-shaped, zigzag-shaped, irregularly shaped, or some combination thereof, and the source pad branch 420 extends from the source pad body 410 toward the drain pad body 460. Similarly, a shape of the drain pad branch 470 may be different depending on product design, and the drain pad branch 470 extends outward from the source pad body 410 or the drain pad body 460. In one embodiment of the present invention, the first source pad 400 or the first drain pad 450 may be electrically connected to external circuits through other conductive devices, such as a bonding wire, a ribbon, a chip, etc., to enable the operation of circuits.

With reference to FIG. 1 and FIG. 2A, in greater detail, an orthogonal projection of the source pad branch 420 on the active layer 100 overlaps at least a portion of the source electrode 200. Hence, the source plugs 500 may be disposed between the source pad branch 420 and the source electrode 200 to provide an adequate electrical connection between the first source pad 400 and the source electrode 200. As a result, a resistance value of the source electrode 200 itself is improved. In addition, when a resistance value of the first source pad 400 per unit length is smaller than a resistance value of the source electrode 200 per unit length (for example in FIG. 2A, a thickness T3 of the first source pad 400 is greater than a thickness T2 of the source electrode 200), the resistance value of the source electrode 200 itself is also improved.

In addition, an orthogonal projection of the drain pad branch 470 on the active layer 100 overlaps at least a portion of the drain electrode 250. Hence, the drain plugs 550 may be disposed between the drain pad branch 470 and the drain electrode 250 to provide an adequate electrical connection between the first drain pad 450 and the drain electrode 250. As a result, a resistance value of the drain electrode 250 itself is improved. In addition, when a resistance value of the first drain pad 450 per unit length is smaller than a resistance value of the drain electrode 250 per unit length (for example in FIG. 2A, a thickness T3 of the first drain pad 450 is greater than a thickness T2 of the drain electrode 250), the resistance value of the drain electrode 250 itself is also improved.

Figure 2B:
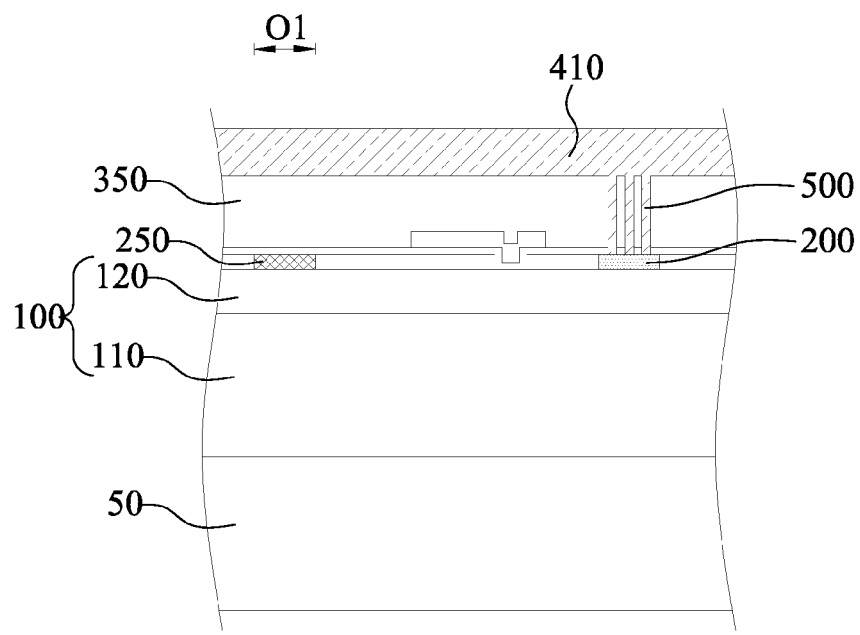
FIG. 2B is a cross-sectional view taken along line 2B-2B of FIG. 1.

FIG. 2B is a cross-sectional view taken along line 2B-2B of FIG. 1. The source plugs 500 may be disposed between the source pad body 410 and the source electrode 200 to provide an adequate electrical connection between the source pad body 410 and the source electrode 200. In addition, because the source pad body 410 is electrically isolated from the drain electrode 250, no plug exists between the source pad body 410 and the drain electrode 250 (that is, the portion of the first insulating layer 350 above the overlapping region O1).

Figure 2C:
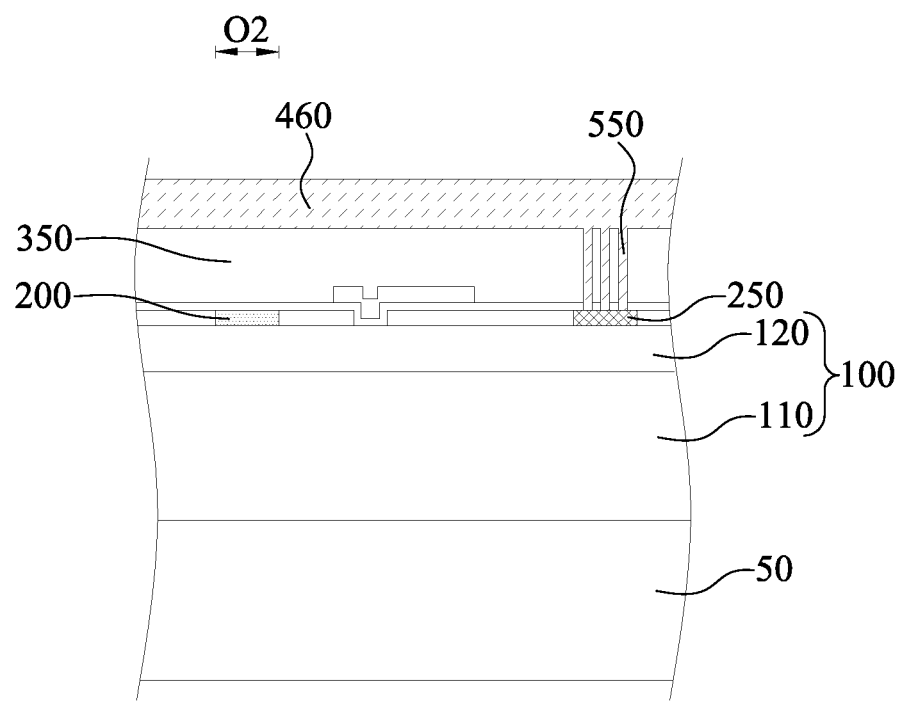
FIG. 2C is a cross-sectional view taken along line 2C-2C of FIG. 1.

FIG. 2C is a cross-sectional view taken along line 2C-2C of FIG. 1. The drain plugs 550 may also be disposed between the drain pad body 460 and the drain electrode 250 to provide an adequate electrical connection between the drain pad body 460 and the drain electrode 250. In addition, because the drain pad body 460 is electrically isolated from the source electrode 200, no plug exists between the drain pad body 460 and the source electrode 200 (that is, the portion of the first insulating layer 350 above the overlapping region O2).

Referring again to FIG. 1, in summary, the first source pad 400 is electrically connected to the source electrodes 200 through the source pad branches 420 and a portion of the source pad body 410. With such a configuration, a sufficient amount of current can flow between the first source pad 400 and the source electrodes 200 to improve the resistance value of the source electrodes 200. Similarly, the first drain pad 450 is electrically connected to the drain electrodes 250 through the drain pad branches 470 and a portion of the drain pad body 460. With such a configuration, a sufficient amount of current can flow between the first drain pad 450 and the drain electrodes 250 to improve the resistance value of the drain electrodes 250.

Referring again to FIG. 1 and FIG. 2A, in the present embodiment, the source electrode 200, the drain electrode 250, and the gate electrode 150 together define an active area 102. The active area 102 includes the source region 202, the drain region 252, and the region between the source region 202 and the drain region 252 in which current passes through the active layer 100. The semiconductor device further includes an insulation area 600 surrounding the active area 102, and at least a portion of the insulation area 600 is located in the active layer 100 to prevent leakage currents from being generated, and thus to increase the breakdown voltage. In FIG. 1, the first source pad 400 and the first drain pad 450 are completely within the active area 102. In other words, the semiconductor device can be cut along the insulation area 600 according to the present embodiment. Hence, the vast majority of the active area 102 is put to good use and it is not necessary to add extra regions to the non-active area for accommodating source pads and drain pads. As a result, the size of the semiconductor device is effectively reduced, or a semiconductor device is fabricated that is able to sustain a higher breakdown voltage or a larger on current with the same device size.

Referring again to FIG. 2A, in one or more embodiments, the active layer 100 includes a plurality of different nitride-based semiconductor layers to allow two-dimensional electron gas (2DEG) to be generated at the heterojunction so as to create a conducting path. For example, a stack structure made up of a gallium nitride (GaN) layer 110 and an aluminum gallium nitride (AlGaN) layer 120 may be utilized, and the aluminum gallium nitride layer 120 is disposed on the gallium nitride layer 110. With this structure, two-dimensional electron gas can exist at the interface of the gallium nitride layer 110 and the aluminum gallium nitride layer 120. Thus, when the semiconductor device is in the on state, the on current between the source electrode 200 and the drain electrode 250 is able to flow along the interface of the gallium nitride layer 110 and the aluminum gallium nitride layer 120. The active layer 100 may be selectively disposed on a substrate 50. The substrate 50 may be a silicon substrate or a sapphire substrate, but the invention is not limited in this respect. In one embodiment, the semiconductor device may further include a buffer layer disposed between the active layer 100 and the substrate 50.

Referring again to FIG. 1, in the present embodiment, the number of the source electrodes 200 and the number of the drain electrodes 250 are both plural. The source electrodes 200 are alternately arranged with the drain electrodes 250 to increase the amount of the on current flowing through the semiconductor device. In order to provide an adequate electrical connection to the source electrodes 200 and the drain electrodes 250, the number of the source pad branches 420 may be plural, and the number of the drain pad branches 470 may also be plural. The source pad branches 420 and the drain pad branches 470 are alternately arranged between the source pad body 410 and the drain pad body 460. All the source pad branches 420 are over the source electrodes 200, and all the drain pad branches 470 are over the drain electrodes 250. Hence, the first source pad 400 and the first drain pad 450 are both in the shape of a finger.

With reference to FIG. 2A, in the present embodiment, the semiconductor device may further include a passivation layer 650 which covers the active layer 100. The passivation layer 650 has at least one source opening 660 and at least one drain opening 670 within it. At least a portion of the source electrode 200 and at least a portion of the drain electrode 250 are respectively disposed in the source opening 660 and the drain opening 670. For example in FIG. 2A, the source electrode 200 and the drain electrode 250 are respectively disposed in the source opening 660 and the drain opening 670 to electrically electrode the active layer 100.

In one or more embodiments, the gate dielectric layer 300 may selectively cover the passivation layer 650, and the gate dielectric layer 300 has at least one first inter-source via hole 310 and at least one first inter-drain via hole 320. A portion of the source plug 500 is filled in the first inter-source via hole 310 to electrically interconnect the first source pad 400 and the source electrode 200. A portion of the drain plug 550 is filled in the first inter-drain via hole 320_to electrically interconnect the first drain pad 450 and the drain electrode 250.

In one or more embodiments, the passivation layer 650 has at least one gate opening 680 within it. The gate electrode 150 and the gate dielectric layer 300 cover the gate opening 680 in a manner conforming to the shape of the gate opening 680. The presence of the gate opening 680 can function to adjust the electrical characteristics of the gate electrode 150. However, in other embodiments, the passivation layer 650 may not have the gate opening 680, and the invention is not limited in this respect.

In the following, the electrical characteristics of the present embodiment semiconductor device are illustrated with reference to FIG. 1 and FIG. 2A. For the sake of convenience, it is worth noting that a single gate electrode 150, a single source electrode 200, and a single drain electrode 250 are utilized for the calculation of the electrical characteristics in the present embodiment. According to the present embodiment, each of the source electrode 200 and the drain electrode 250 has a width W=4 μm and a length L2=1000 μm, and so the area of each of the source region 202 and the area of the drain region 252 is L2*W=4000 μm². In addition, the overlapping region O1 has a length L1=100 μm and the overlapping region O2 has a length L3=100 μm. Hence, the area of the overlapping region O1 is L1*W=400 μm² and the area of the overlapping region O2 is L3*W=400 μm². That is, the area of the overlapping region O1 is equal to 10% of the area of the drain region 252, and the area of the overlapping region O2 is equal to 10% of the area of the source region 202. When compared with the traditional vertical circuit layout structure, the amount of parasitic capacitance generated in the present invention structure is 20% of that generated in the traditional vertical circuit layout structure.

The source electrode 200 and the drain electrode 250 both have a thickness T2=0.2 μm. The first source pad 400 and the first drain pad 450 both have a thickness T3=4 μm. A distance between the source pad body 410 and the drain pad branch 470 is D1=10 μm. A distance between the drain pad body 460 and the source pad branch 420 is D2=10 μm. The source pad branch 420 has a width Ws=15 μm and the drain pad branch 470 has a width Wd=4.2 μm. In addition, the resistivities of the source electrode 200, the drain electrode 250, the first source pad 400, and the first drain pad 450 are all ρ. Since the resistance values of the source electrode 200 and the drain electrode 250 per unit length are much greater than the resistance values of the first source pad 400 and the first drain pad 450 per unit length, effects contributed by the source electrode 200 and the drain electrode 250 can be negligible when calculating the total effects in areas where the first source pad 400 and the first drain pad 450 are located to thereby simplify the calculation. Based on the above, the total resistance of the source electrode 200 and the first source pad 400 is approximately calculated as Rs=ρ*(L3+D2)/(T2*W)+ρ*(L2−L3−D2−L1)/(T3*Ws)~151*ρ (here the resistance of the source pad body 410 is negligible). The total resistance of the drain electrode 250 and the first drain pad 450 is approximately calculated as Rd=ρ*(L1+D1)/(T2*W)+ρ*(L2−L1−D1−L3)/(T3*Wd)~185*ρ (here the resistance of the drain pad body 460 is negligible). If the material of the source electrode 200, the drain electrode 250, the first source pad 400, and the first drain pad 450 is not changed, the Rs or Rd of the source pads or the drain pads in the traditional vertical circuit layout structure is approximately 625 ρ. It is apparent that both the resistance and parasitic capacitance generated in the semiconductor device of the present embodiment are smaller than those generated in the prior art vertical circuit layout structure. In addition, an area utilization ratio of the semiconductor device of the present embodiment is higher than that in the prior art horizontal circuit layout structure (areas required by the source pads and the drain pads are all outside the active area).

Figure 3:
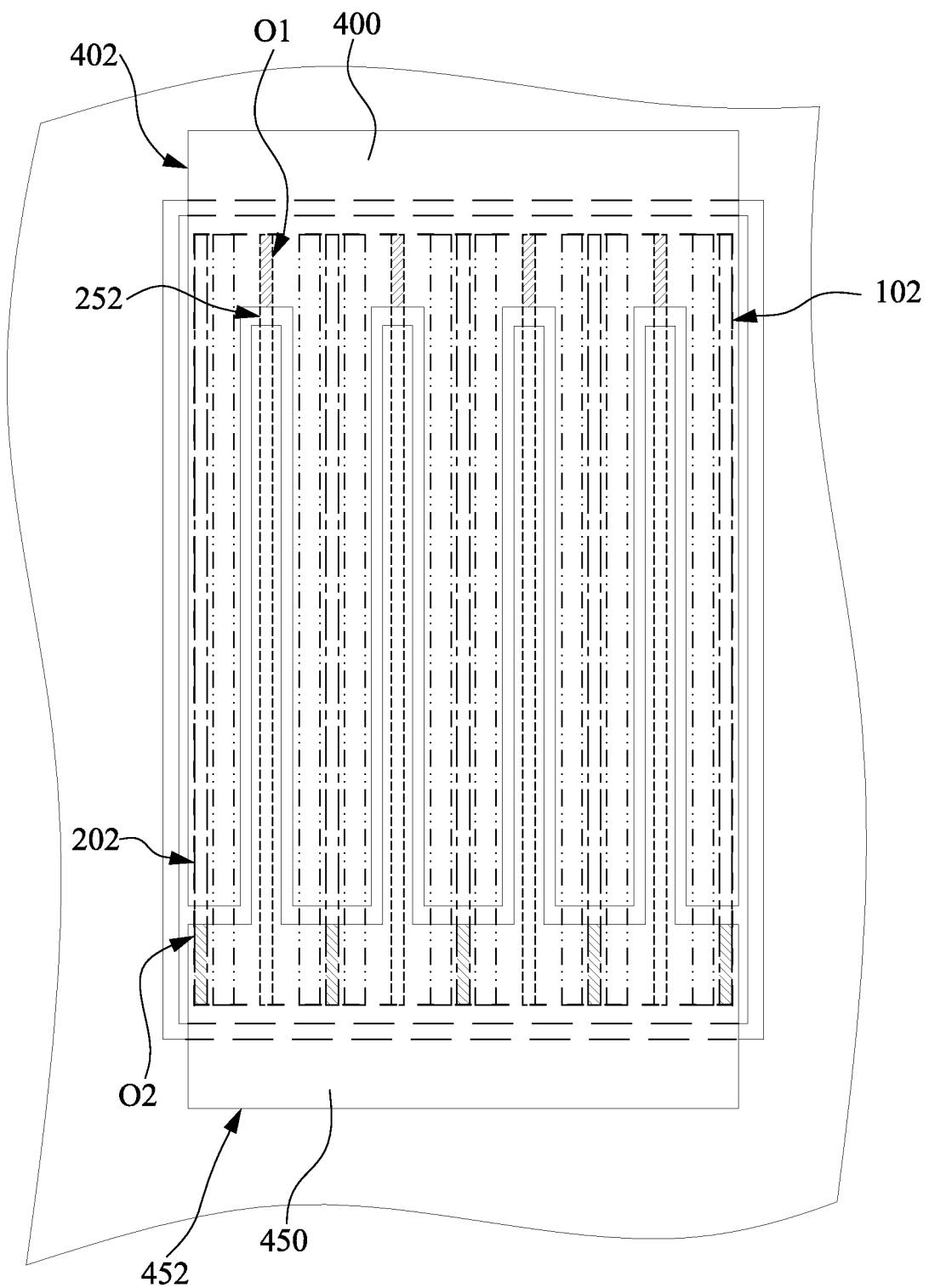
FIG. 3 is a top view of a semiconductor device according to a second embodiment of the present invention.

FIG. 3 is a top view of a semiconductor device according to a second embodiment of the present invention. The semiconductor device in the present embodiment differs from the semiconductor device in the first embodiment with respect to positions of the first source pad 400 and the first drain pad 450. In the present embodiment, at least a portion of the source pad region 402 formed by the first source pad 400 on the active layer 100 (as shown in FIG. 2A) is outside the active area 102, and at least a portion of the drain pad region 452 formed by the first drain pad 450 on the active layer 100 is outside the active area 102. Basically, any design in which the source pad region 402 and the drain region 252 form the overlapping region O1 and the area of the overlapping region O1 is smaller than or equal to 40% of the area of the drain region 252, or in which the drain pad region 452 and the source region 202 form the overlapping region O2 and the area of the overlapping region O2 is smaller than or equal to 40% of the area of the source region 202 is within the scope of the invention. Since other details of the present embodiment are the same as those in the first embodiment, a further description in this regard is not provided.

Furthermore, in the first embodiment the source pad region 402 and the drain pad region 452 are both within the active area 102. In the second embodiment, both a portion of the source pad region 402 and the drain pad region 252 are outside the active area 102. However, in other embodiments, the source pad region 402 may be within the active area 102 and a portion of the drain pad region 452 may be outside the active area 102, and vice versa.

Figure 4:
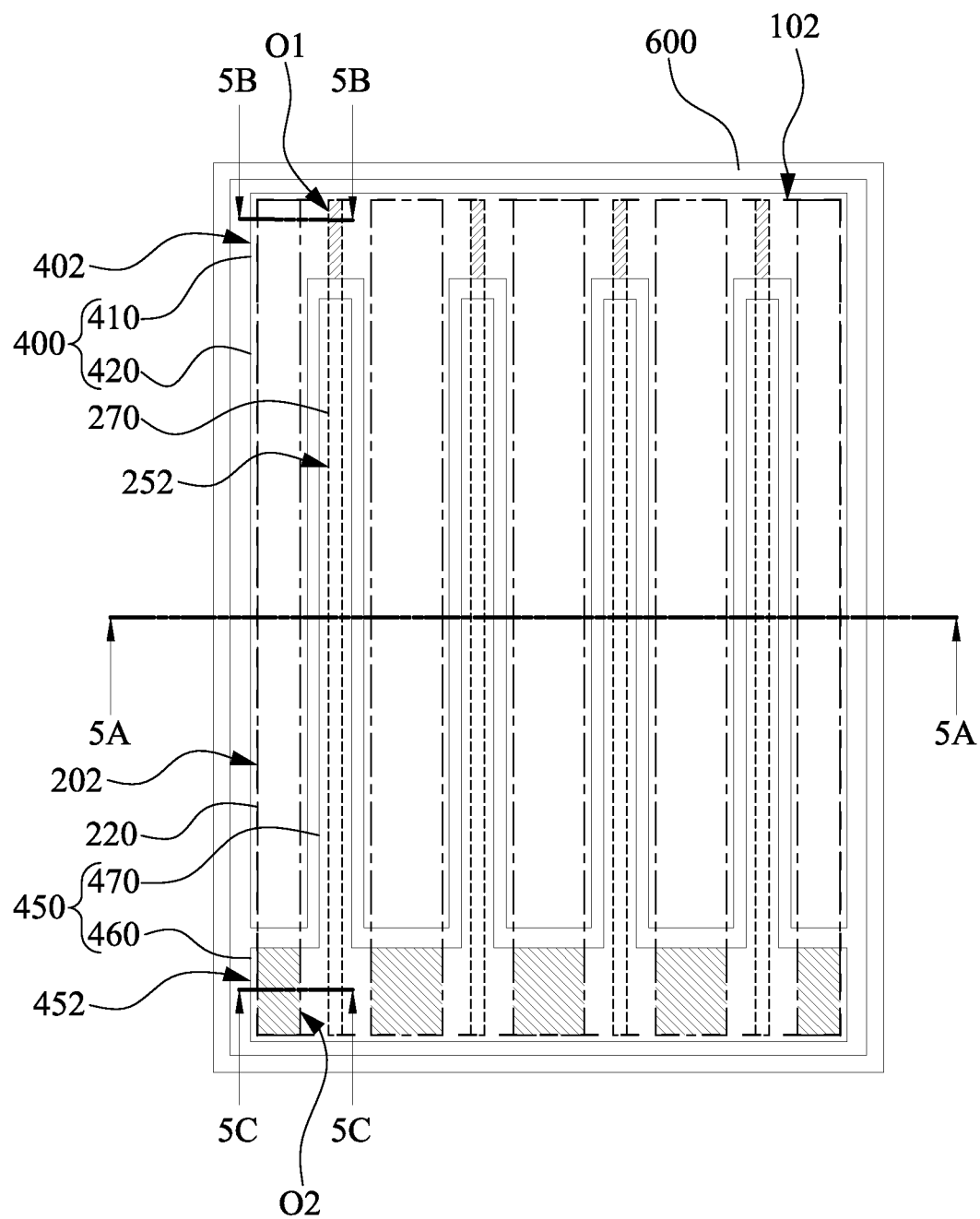
FIG. 4 is a top view of a semiconductor device according to a third embodiment of the present invention.
Figure 5A:
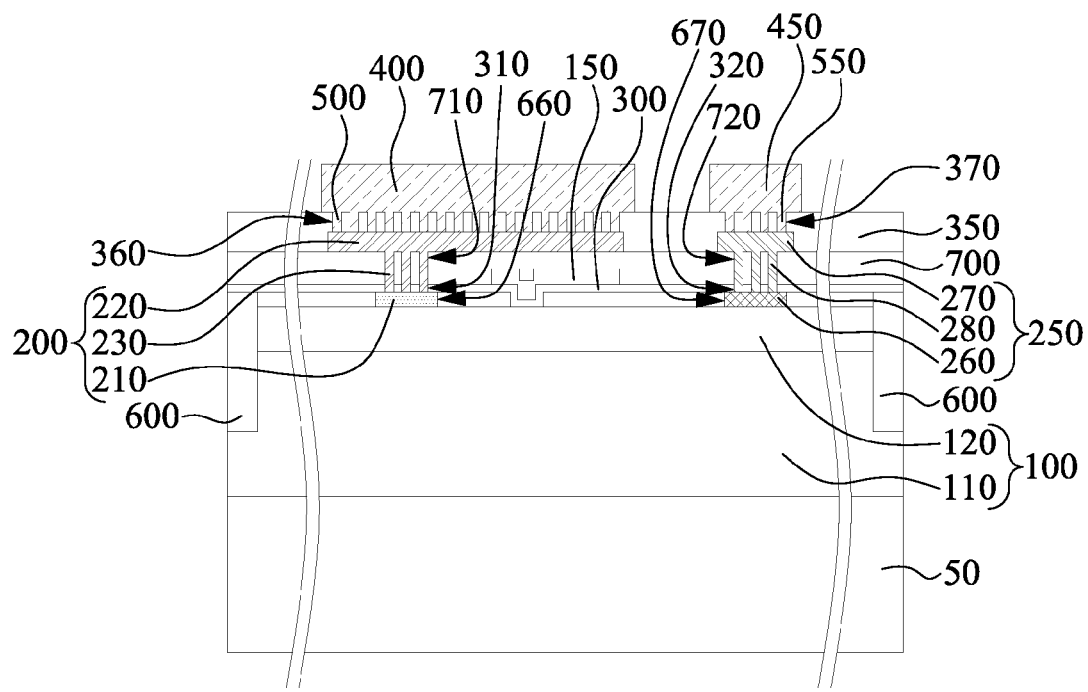
FIG. 5A is a cross-sectional view taken along line 5A-5A of FIG. 4.

FIG. 4 is a top view of a semiconductor device according to a third embodiment of the present invention. FIG. 5A is a cross-sectional view taken along line 5A-5A of FIG. 1. The present embodiment differs from the first embodiment with respect to structures of the source electrode 200 and the drain electrode 250 and the disposition of an interlayer dielectric 700. In the present embodiment, the semiconductor device further includes the interlayer dielectric 700 that covers the gate dielectric layer 300. The interlayer dielectric 700 has at least one second inter-source via hole 710. The source electrode 200 includes a lower sub-source electrode 210, an upper sub-source electrode 200, and at least one inter-source plug 230. The lower sub-source electrode 210 is disposed in the source opening 660, and the upper sub-source electrode 220 is disposed on the interlayer dielectric 700. The inter-source plug 230 is filled in the first inter-source via hole 310 and the second inter-source via hole 710, and electrically connected to the upper sub-source electrode 220 and the lower sub-source electrode 210.

In addition, the interlayer dielectric 700 has at least one second inter-drain via hole 720. The drain electrode 250 includes a lower sub-drain electrode 260, an upper sub-drain electrode 270, and at least one inter-drain plug 280. The lower sub-drain electrode 260 is disposed in the drain opening 670, and the upper sub-drain electrode 270 is disposed on the interlayer dielectric 700. The inter-drain plug 280 is filled in the first inter-drain via hole 320 and the second inter-drain via hole 720 and electrically connected to the upper sub-drain electrode 270 and the lower sub-drain electrode 260.

In the present embodiment, the lower sub-source electrode 210 of the source electrode 200 directly electrodes the active layer 100 and may be an ohmic electrode having a large resistance value per unit length. Hence, the upper sub-source electrode 220 that has a resistance value per unit length smaller than the resistance value of the lower sub-source electrode 210 per unit length is added over the lower sub-source electrode 210. As a result, the overall resistance value of the source electrode 200 is reduced by electrically connecting the upper sub-source electrode 220 to the lower sub-source electrode 210.

Similarly, the lower sub-drain electrode 260 of the drain electrode 250 directly electrodes the active layer 100 and may be an ohmic electrode having a large resistance value per unit length. Hence, the upper sub-drain electrode 270 that has a resistance value per unit length smaller than the resistance value of the lower sub-drain electrode 260 per unit length is added over the lower sub-drain electrode 260. As a result, the overall resistance value of the drain electrode 250 is reduced by electrically connecting the upper sub-drain electrode 270 to the lower sub-drain electrode 260.

Figure 5B:
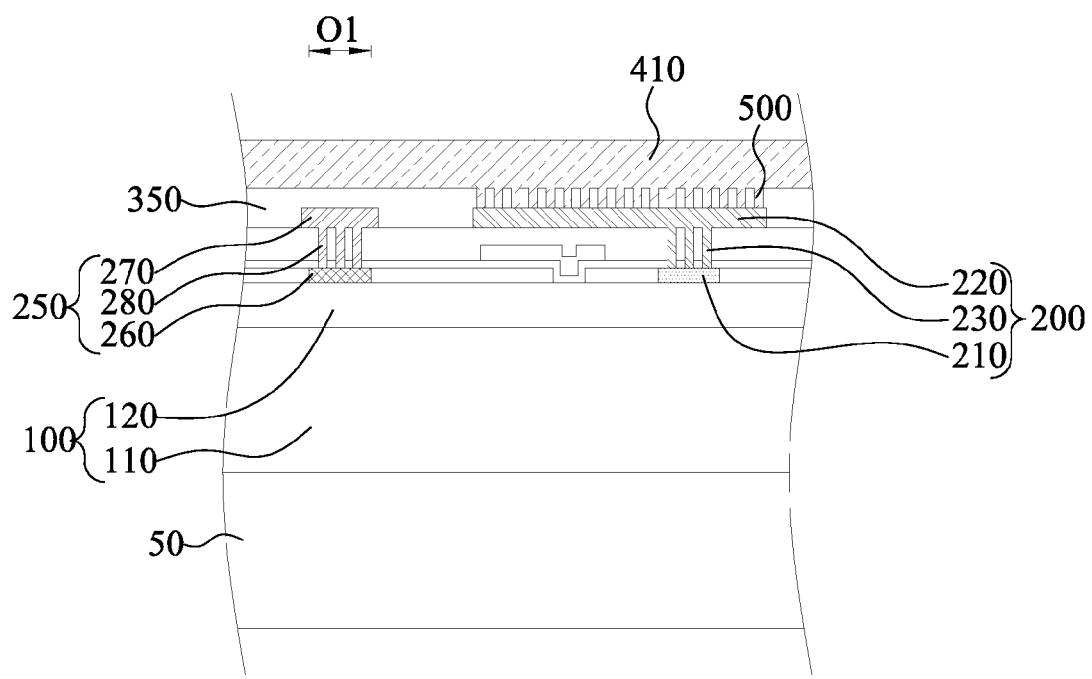
FIG. 5B is a cross-sectional view taken along line 5B-5B of FIG. 4.

FIG. 5B is a cross-sectional view taken along line 5B-5B of FIG. 4. A detailed description of electrical connections between the various electrode layers below the source pad body 410 will now be provided. First, the source pad body 410 is electrically connected to the upper sub-source electrode 220 through the source plugs 500. The upper sub-source electrode 220 and the lower sub-source electrode 210 below the source pad body 410 are electrically connected through the inter-source plugs 230. Hence, a sufficient amount of current can flow between the source electrode 200 and the source pad body 410. In addition, the upper sub-drain electrode 270 and the lower sub-drain electrode 260 below the source pad body 410 are electrically connected through the inter-drain plugs 280. Hence, a sufficient amount of current can flow between the upper sub-drain electrode 270 and the lower sub-drain electrode 260.

Figure 5C:
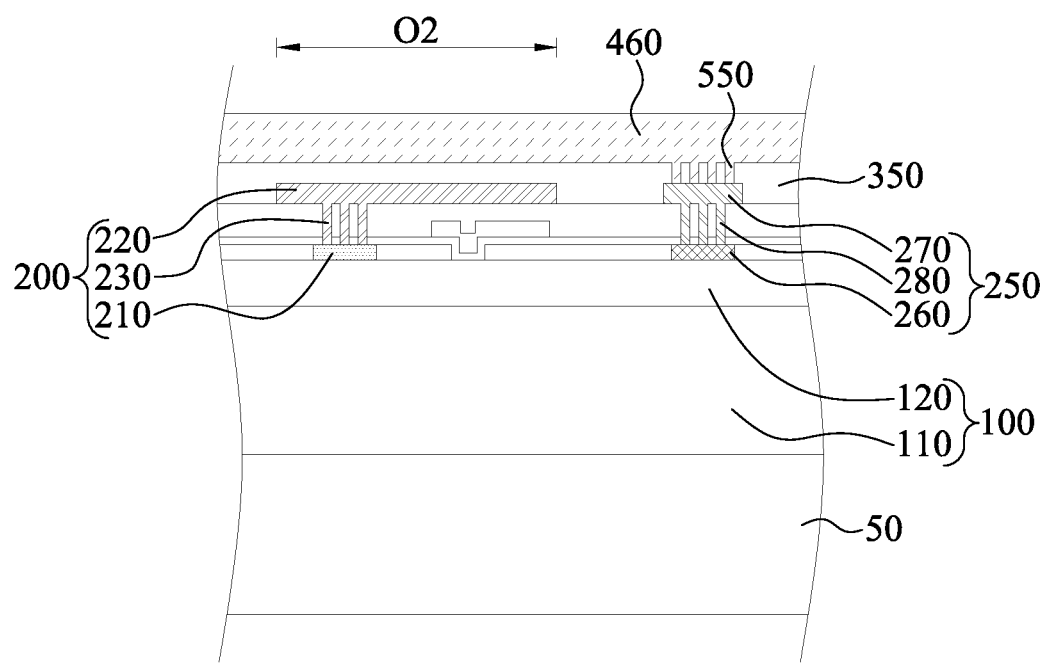
FIG. 5C is a cross-sectional view taken along line 5C-5C of FIG. 4.

FIG. 5C is a cross-sectional view taken along line 5C-5C of FIG. 4. A detailed description of electrical connections between the various electrode layers below the drain pad body 460 will now be provided. First, the drain pad body 460 is electrically connected to the upper sub-drain electrode 270 through the drain plugs 550. The upper sub-drain electrode 270 and the lower sub-drain electrode 260 below the drain pad body 460 are electrically connected through the inter-drain plugs 280. Hence, a sufficient amount of current can flow between the drain electrode 250 and the drain pad body 460. In addition, the upper sub-source electrode 220 and the lower sub-source electrode 210 below the drain pad body 460 are electrically connected through the inter-source plugs 230. Hence, a sufficient amount of current can flow between the upper sub-source electrode 220 and the lower sub-source electrode 210. Since other details of the present embodiment are the same as those in the first embodiment, a further description in this regard is not provided.

Figure 6:
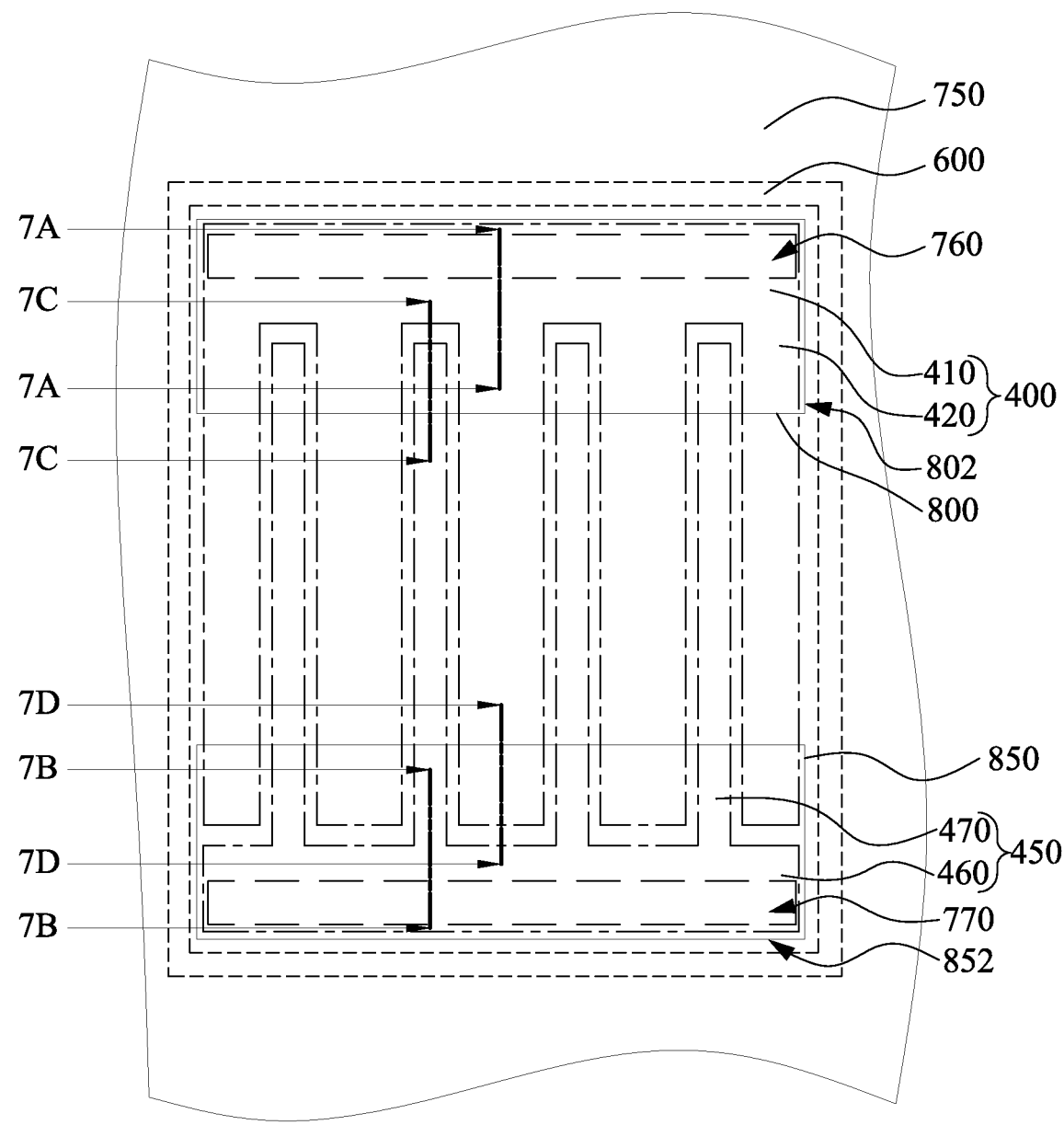
FIG. 6 is a top view of a semiconductor device according to a fourth embodiment of the present invention.
Figure 7A:
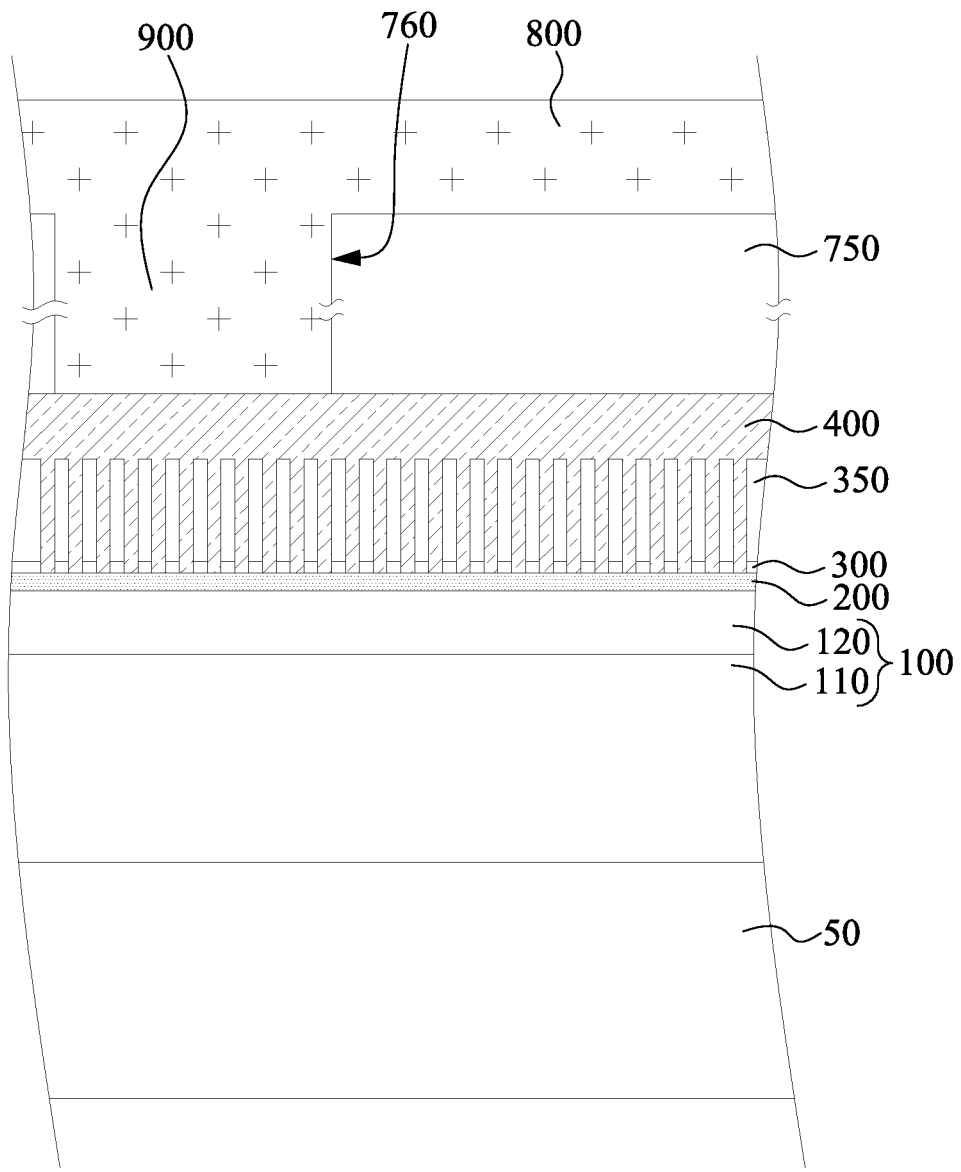
FIG. 7A is a cross-sectional view taken along line 7A-7A of FIG. 6.
Figure 7B:
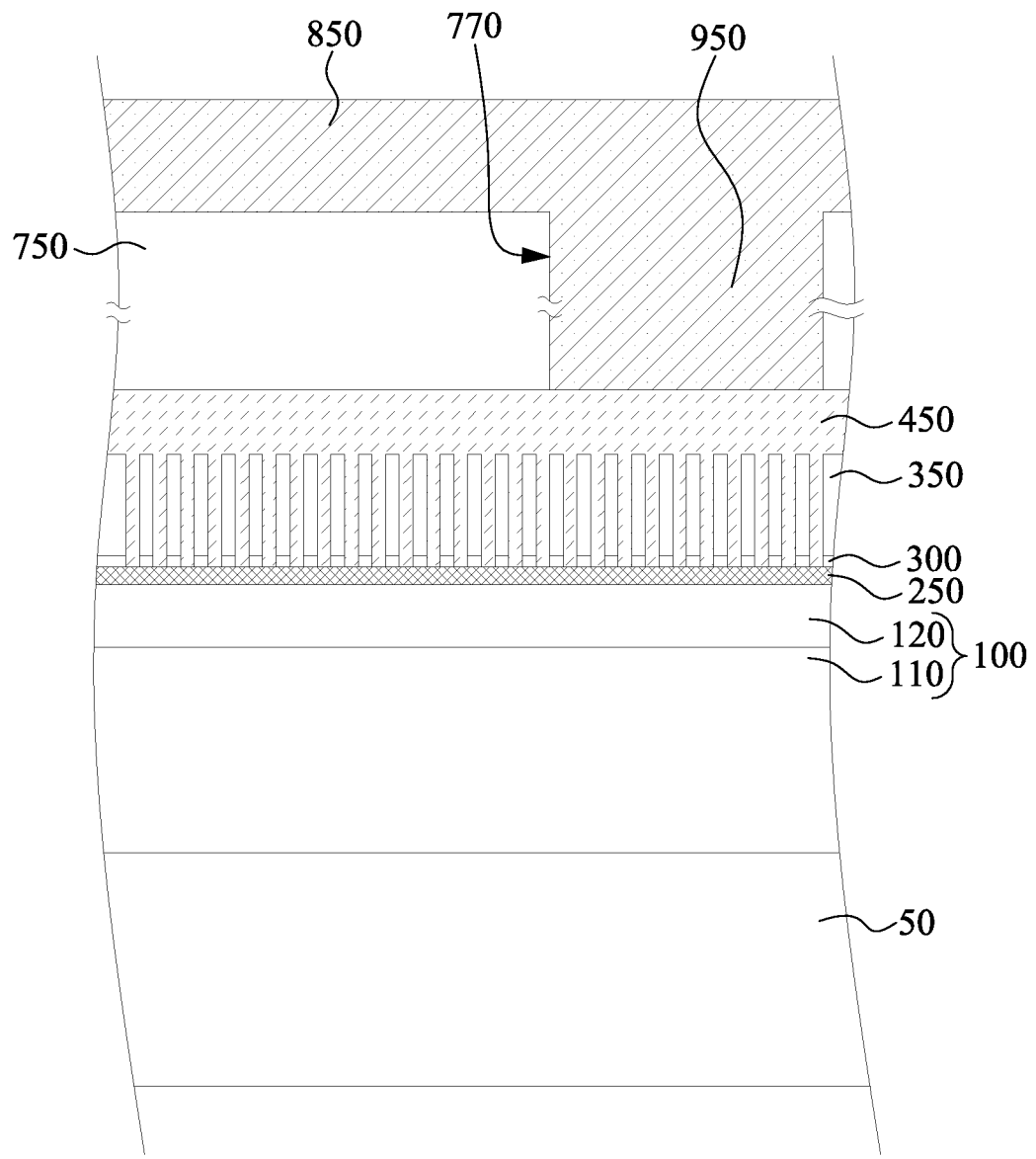
FIG. 7B is a cross-sectional view taken along line 7B-7B of FIG. 6.
Figure 7C:
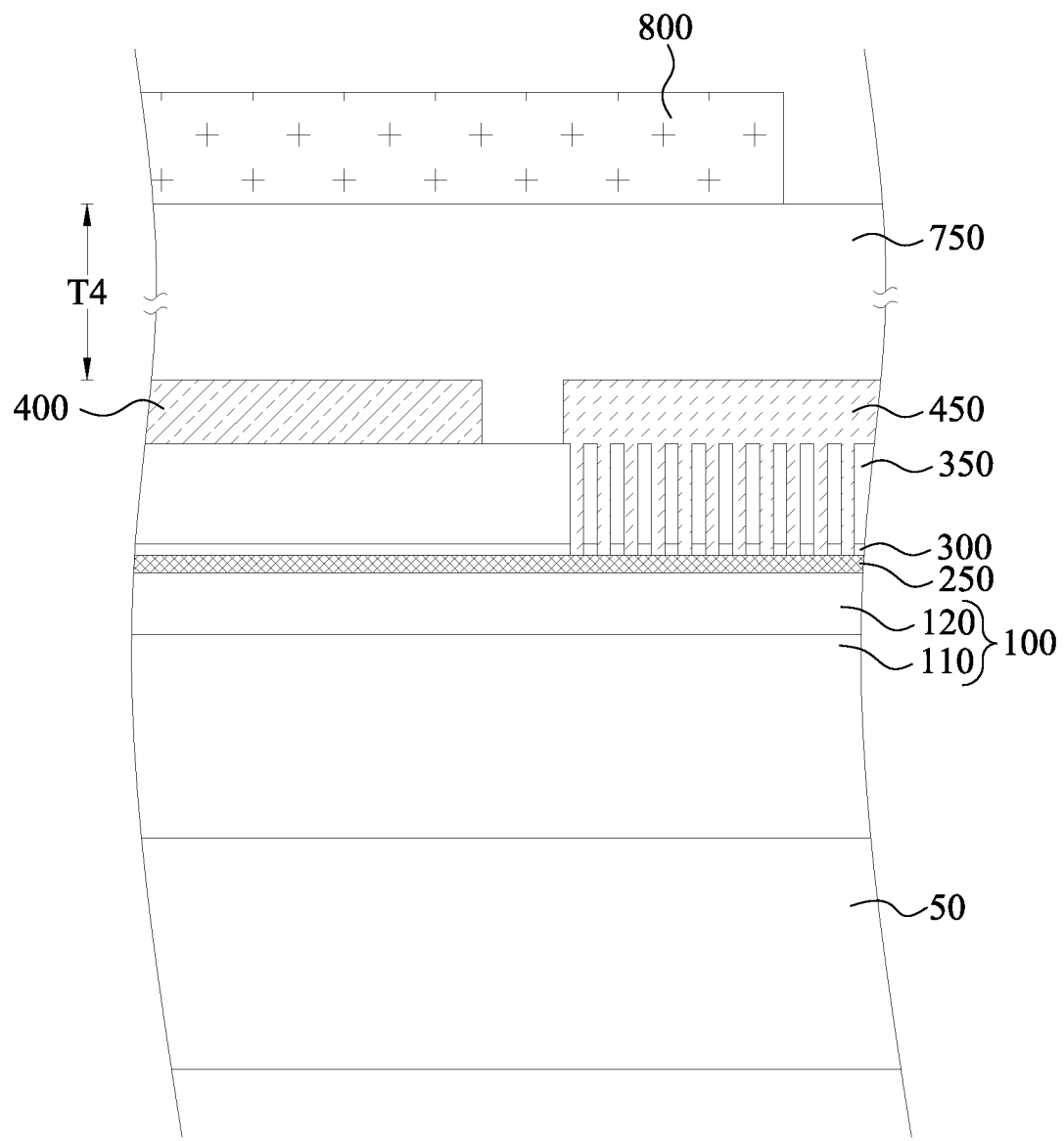
FIG. 7C is a cross-sectional view taken along line 7C-7C of FIG. 6.
Figure 7D:
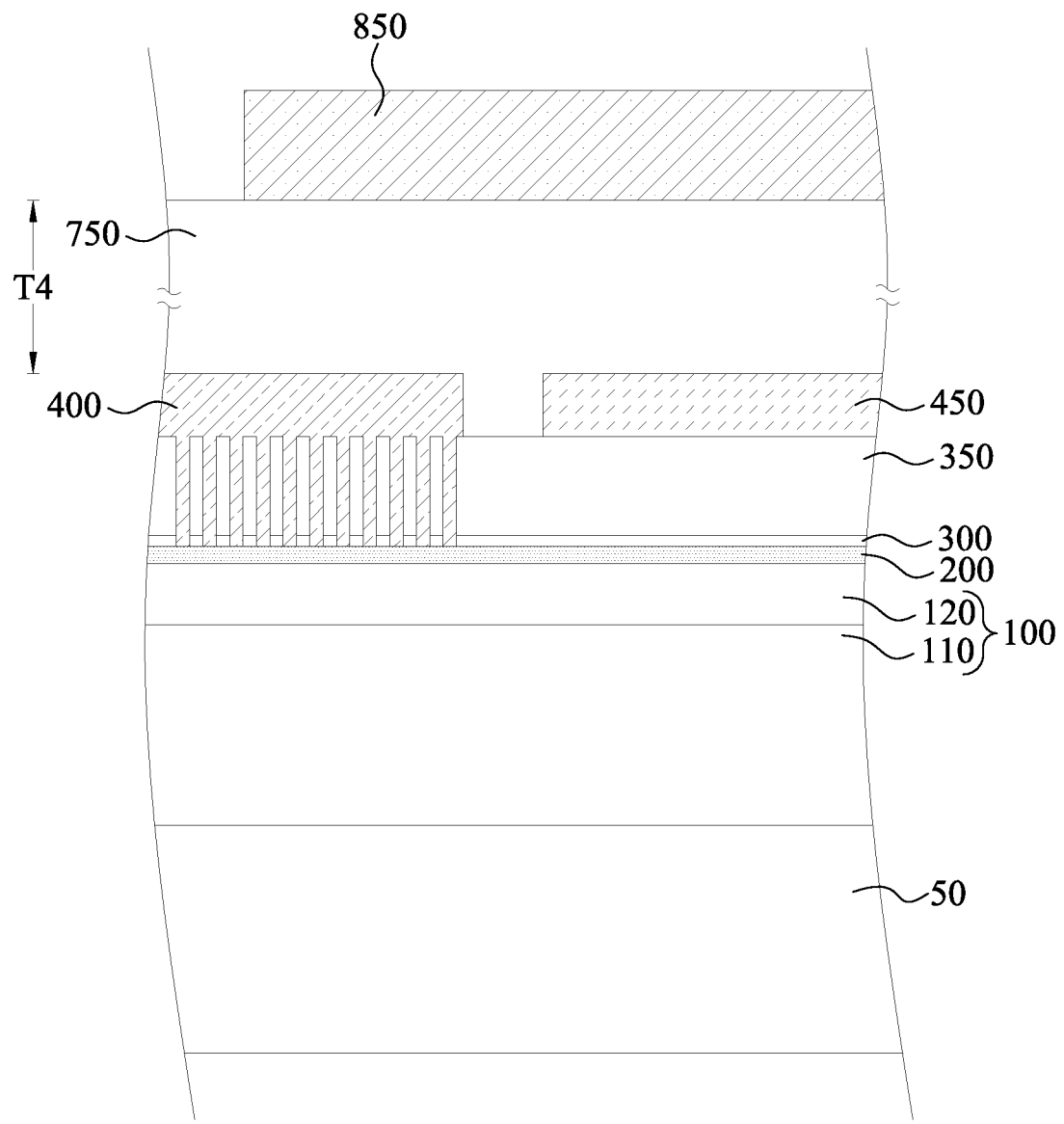
FIG. 7D is a cross-sectional view taken along line 7D-7D of FIG. 6.

FIG. 6 is a top view of a semiconductor device according to a fourth embodiment of the present invention. FIG. 7A is a cross-sectional view taken along line 7A-7A of FIG. 6. FIG. 7B is a cross-sectional view taken along line 7B-7B of FIG. 6. FIG. 7C is a cross-sectional view taken along line 7C-7C of FIG. 6. FIG. 7D is a cross-sectional view taken along line 7D-7D of FIG. 6. The present embodiment differs from the first embodiment with respect to the disposition of a second insulating layer 750, a second source pad 800, a second drain pad 850, a source pad connection portion 900, and a drain pad connection portion 950. With reference to FIG. 6, FIG. 7A, and FIG. 7C, in the present embodiment, the second insulating layer 750 is disposed on the first source pad 400 and the first insulating layer 350. The second insulating layer 750 has a source pad opening 760 to expose a portion of the first source pad 400, and the second insulating layer 750 has a thickness T4 greater than 7 μm. The second source pad 800 is disposed on the second insulating layer 750. The source pad connection portion 900 is disposed in the source pad opening 760 and is electrically connected to the first source pad 400 and the second source pad 800. As shown in FIG. 7A, the second source pad 800 and the first source pad 400 are electrically connected through the source pad connection portion 900. As shown in FIG. 7C, despite the parasitic capacitance generated in the overlapping region formed by the second source pad 800 and the first drain pad 450, the capacitance value of the parasitic capacitance is not large because the thickness T4 of the second insulating layer 750 is greater than 7 μm. Hence, an area of a region 802 formed by an orthogonal projection of the second source pad 800 on the active layer 100 may be greater than an area of the region formed by the orthogonal projection of the source pad body 410 on the active layer 100 to facilitate connection with external circuits.

With reference to FIG. 6, FIG. 7B, and FIG. 7D, the second insulating layer 750 is further disposed on the first drain pad 450. The second insulating layer 750 has a drain pad opening 770 to expose a portion of the first drain pad 450. The second drain pad 850 is separate from the second source pad 800 and is disposed on the second insulating layer 750. The drain pad connection portion 950 is disposed in the drain pad opening 770 and is electrically connected to the first drain pad 450 and the second drain pad 850. As shown in FIG. 7B, the second drain pad 850 and the first drain pad 450 are electrically connected through the drain pad connection portion 950. As shown in FIG. 7D, despite the parasitic capacitance generated in the overlapping region formed by the second drain pad 850 and the first source pad 400, the capacitance value of the parasitic capacitance is not large because the thickness T4 of the second insulating layer 750 is greater than 7 μm. Hence, an area of a region 852 formed by an orthogonal projection of the second drain pad 850 on the active layer 100 may be greater than an area of the region formed by the orthogonal projection of the drain pad body 460 on the active layer 100 to facilitate connection with external circuits.

In the present embodiment, a material of the second insulating layer 750 includes polyimide (PI), photoresist (PR), benzo cyclo butane (BCB), spin on glass (SOG), plastic, or their combinations. The second insulating layer 750 may be formed on the first source pad 400, the first drain pad 450, and the first insulating layer 350 by, for example, spin coating, but the invention is not limited in this respect. Since other details of the present embodiment are the same as those in the first embodiment, a further description in this regard is not provided. It is worth noting that in the present embodiment, the second insulating layer 750, the second source pad 800, the second drain pad 850, the source pad connection portion 900, and the drain pad connection portion 950 are all disposed on the semiconductor device of the first embodiment. However, in other embodiments, the second insulating layer 750, the second source pad 800, the second drain pad 850, the source pad connection portion 900, and the drain pad connection portion 950 may be disposed on the semiconductor device of the second embodiment or the third embodiment.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:
1. A semiconductor device, comprising:
an active layer;
at least one source electrode disposed on the active layer, an orthogonal projection of the source electrode on the active layer forming a source region;
at least one drain electrode disposed on the active layer, the drain electrode being separate from the source electrode, and an orthogonal projection of the drain electrode on the active layer forming a drain region;
at least one gate electrode disposed above the active layer and between the source electrode and the drain electrode;
a first insulating layer at least covering a portion of the source electrode and a portion of the drain electrode, the first insulating layer having at least one source via hole and at least one drain via hole within the first insulating layer;

a first source pad disposed on the first insulating layer, an orthogonal projection of the first source pad on the active layer forming a source pad region, the source pad region overlapping at least a portion of the drain region, and an area of an overlapping region between the source pad region and the drain region being smaller than or equal to 40% of an area of the drain region;

a first drain pad disposed on the first insulating layer;

at least one source plug filled in the source via hole and electrically connected to the first source pad and the source electrode; and at least one drain plug filled in the drain via hole and electrically connected to the first drain pad and the drain electrode.

2. The semiconductor device of claim 1, wherein an orthogonal projection of the first drain pad on the active layer forms a drain pad region, the drain pad region overlaps at least a portion of the source region, and an area of an overlapping region between the drain pad region and the source region is smaller than or equal to 40% of an area of the source region.

3. The semiconductor device of claim 1, wherein a resistance value of the first source pad per unit length is smaller than a resistance value of the source electrode per unit length.

4. The semiconductor device of claim 1, wherein a resistance value of the first drain pad per unit length is smaller than a resistance value of the drain electrode per unit length.

5. The semiconductor device of claim 1, wherein the orthogonal projection of the source electrode on the active layer, the orthogonal projection of the drain electrode on the active layer, and an orthogonal projection of the gate electrode on the active layer together define an active area, and at least a portion of the source pad region is within the active area.

6. The semiconductor device of claim 5, wherein the source pad region is completely within the active area.

7. The semiconductor device of claim 1, wherein the orthogonal projection of the source electrode on the active layer, the orthogonal projection of the drain electrode on the active layer, and an orthogonal projection of the gate electrode on the active layer together define an active area, an orthogonal projection of the first drain pad on the active layer forms a drain pad region, and at least a portion of the drain pad region is within the active area.

8. The semiconductor device of claim 7, wherein the drain pad region is completely within the active area.

9. The semiconductor device of claim 1, wherein the first source pad comprises:

a source pad body, an orthogonal projection of the source pad body on the active layer overlapping at least a portion of the drain region; and at least one source pad branch;

wherein the first drain pad comprises:

a drain pad body separate from the source pad body, an orthogonal projection of the drain pad body on the active layer overlapping at least a portion of the source region, and the source pad branch extending from the source pad body toward the drain pad body; and at least one drain pad branch extending from the drain pad body toward the source pad body.

10. The semiconductor device of claim 9, wherein the number of the source pad branches is plural, the number of the drain pad branches is plural, and the source pad branches and the drain pad branches are alternately arranged between the source pad body and the drain pad body.

11. The semiconductor device of claim 1, further comprising:

a passivation layer covering the active layer, the passivation layer having at least one source opening and at least one drain opening within the passivation layer, at least a portion of the source electrode and at least a portion of the drain electrode being respectively disposed in the source opening and the drain opening to electrically electrode the active layer.

12. The semiconductor device of claim 11, further comprising a gate dielectric layer disposed at least between the gate electrode and the active layer.

13. The semiconductor device of claim 12, wherein the gate dielectric layer further covers the passivation layer, and the gate dielectric layer has at least one first inter-source via hole;

wherein the semiconductor device further comprises:

an interlayer dielectric covering the gate dielectric layer, the interlayer dielectric having at least one second inter-source via hole; and wherein the source electrode further comprises:

a lower sub-source electrode disposed in the source opening;

an upper sub-source electrode disposed on the interlayer dielectric; and at least one inter-source plug filled in the first inter-source via hole and the second inter-source via hole and electrically connected to the upper sub-source electrode and the lower sub-source electrode.

14. The semiconductor device of claim 13, wherein a resistance value of the upper sub-source electrode per unit length is smaller than a resistance value of the lower sub-source electrode per unit length.

15. The semiconductor device of claim 12, wherein the gate dielectric layer further covers the passivation layer, and the gate dielectric layer has at least one first inter-drain via hole;

wherein the semiconductor device further comprises:

an interlayer dielectric covering the gate dielectric layer, the interlayer dielectric having at least one second inter-drain via hole; and wherein the drain electrode further comprises:

a lower sub-drain electrode disposed in the drain opening;

an upper sub-drain electrode disposed on the interlayer dielectric; and at least one inter-drain plug filled in the first inter-drain via hole and the second inter-drain via hole and electrically connected to the upper sub-drain electrode and the lower sub-drain electrode.

16. The semiconductor device of claim 15, wherein a resistance value of the upper sub-drain electrode per unit length is smaller than a resistance value of the lower sub-drain electrode per unit length.

17. The semiconductor device of claim 1, wherein the active layer comprises:

a gallium nitride layer; and an aluminum gallium nitride layer disposed on the gallium nitride layer.

18. The semiconductor device of claim 1, further comprising:

a second insulating layer disposed on the first source pad, the first drain pad, and the first insulating layer, wherein the second insulating layer has a source pad opening and a drain pad opening to respectively expose a portion of the first source pad and a portion of the first drain pad, and the second insulating layer has a thickness greater than 7 μm;

a second source pad disposed on the second insulating layer;

a second drain pad separate from the second source pad and disposed on the second insulating layer;

a source pad connection portion disposed in the source pad opening and electrically connected to the first source pad and the second source pad; and a drain pad connection portion disposed in the drain pad opening and electrically connected to the first drain pad and the second drain pad.

19. The semiconductor device of claim 1, wherein a material of the second insulating layer comprises polyimide (PI), photoresist (PR), benzo cyclo butane (BCB), spin on glass (SOG), plastic, or their combinations.

20. A semiconductor device, comprising:

an active layer;

at least one source electrode disposed on the active layer, an orthogonal projection of the source electrode on the active layer forming a source region;

at least one drain electrode disposed on the active layer, the drain electrode being separate from the source electrode, and an orthogonal projection of the drain electrode on the active layer forming a drain region;

at least one gate electrode disposed above the active layer and between the source electrode and the drain electrode;

a first insulating layer at least covering a portion of the source electrode and a portion of the drain electrode, the first insulating layer having at least one source via hole and at least one drain via hole within the first insulating layer;

a first source pad disposed on the first insulating layer;

a first drain pad disposed on the first insulating layer, an orthogonal projection of the first drain pad on the active layer forming a drain pad region, the drain pad region overlapping at least a portion of the source region, and an area of an overlapping region between the drain pad region and the source region being smaller than or equal to 40% of an area of the source region;

at least one source plug filled in the source via hole and electrically connected to the first source pad and the source electrode; and at least one drain plug filled in the drain via hole and electrically connected to the first drain pad and the drain electrode.

* * * * *